(12) United States Patent
Katsir et al.

(10) Patent No.: US 6,764,712 B2
(45) Date of Patent: Jul. 20, 2004

(54) METHOD FOR PRODUCING HIGH SURFACE AREA FOIL ELECTRODES

(75) Inventors: Dina Katsir, Beer Sheva (IL); Iris Tartakovsky, Kiryat Gat (IL); Israel Tartakovsky, Kiryat Gat (IL)

(73) Assignee: Acktar Ltd, Kiryat Gat (IL)

( * ) Notice: Subject to any disclaimer, the term of this patent is extended or adjusted under 35 U.S.C. 154(b) by 0 days.

(21) Appl. No.: 09/745,347

(22) Filed: Dec. 21, 2000

(65) Prior Publication Data

US 2001/0006735 A1 Jul. 5, 2001

Related U.S. Application Data

(62) Division of application No. 09/033,664, filed on Mar. 3, 1998, now Pat. No. 6,287,673.

(51) Int. Cl.[7] .............................. B05D 5/12; H01G 9/00
(52) U.S. Cl. .......................... 427/80; 427/81; 427/123; 427/126.4; 29/25.03; 29/25.41; 29/25.42
(58) Field of Search ............................ 29/25.03, 25.41, 29/25.42; 427/255.19, 255.23, 58, 80, 81, 126.4, 123

(56) References Cited

U.S. PATENT DOCUMENTS

| 3,579,063 | A | * | 5/1971 | Wasa et al. ................. 317/258 |
| 4,309,810 | A | * | 1/1982 | Drake ........................ 29/570 |
| 4,970,626 | A | * | 11/1990 | Kakinoki et al. ........... 361/512 |
| 5,431,971 | A | * | 7/1995 | Allegret et al. ............. 428/148 |

FOREIGN PATENT DOCUMENTS

JP            9710        *   1/1993

* cited by examiner

*Primary Examiner*—Brian K. Talbot

(57) ABSTRACT

A method for increasing the surface area of foil electrodes of electrolytic capacitors. A valve metal is deposited by evaporation on a valve metal foil in a low pressure inert atmosphere including oxygen at a pressure one to two orders of magnitude lower than the pressure of the inert gas. The resulting surface is fractal-like. The foil thus treated is suitable as such for use as a cathode. Prior to anodization to produce an anode, a discontinuous layer of a valve metal oxide is deposited on the foil, to preserve the high surface area of the fractal-like surface and otherwise promote the formation of a dielectric coating whose interface with the metal foil has a high surface area.

12 Claims, 5 Drawing Sheets

METHOD FOR PRODUCING HIGH SURFACE AREA FOIL ELECTRODES

This is a divisional, of application Ser. No. 9/033,664, filed Mar. 3, 1998 now U.S. Pat. No. 6,287,673.

FIELD AND BACKGROUND OF THE INVENTION

The present invention relates to electrodes for electrolytic capacitors and, more particularly, to a method for producing such electrodes, particularly anodes but also cathodes, having increased surface area, and the electrodes so produced.

An electrolytic capacitor is a capacitor in which one plate is metallic and the other plate is an electrolyte. Intervening between the two plates is a dielectric consisting of a surface oxide coating on the metal plate. Conventionally, the metal plate on which the dielectric coating is formed is referred to as the anode. The term "anode" is used herein to refer both to the metal plate itself and to the combination of the metal plate with the dielectric coating. It will be clear from the context which meaning of "anode" is intended. A transition between ionic conduction in the electrolyte and electronic conduction in an external circuit is provided by a second metal plate which is referred to herein as the cathode. The anode and the cathode are referred to herein collectively as electrodes. Typically, the anode and the cathode are thin foils.

Typically, the metal of the anode is a valve metal, i.e., a metal which, when oxidized, allows current to pass if used as a cathode but opposes the flow of current when used as an anode. Examples of valve metals include magnesium, thorium, cadmium, tungsten, tin, iron, silver, silicon, tantalum, titanium, aluminum, zirconium and niobium.

As is the case with capacitors generally, the capacitance of an electrolytic capacitor is proportional to the surface areas of its two plates. Conventionally, the surface areas of the foils are increased by etching. In the case of very thin foils, this has the disadvantage of weakening the foils mechanically, making it difficult to fabricate electrolytic capacitors by high speed winding.

Recently, vacuum deposition has been proposed for increasing the surface areas of foil electrodes. Kakinoki et al., in U.S. Pat. No. 4,970,626, report the vacuum deposition of titanium on aluminum foil, at an angle, to produce a titanium surface with a rough, columnar structure. The disadvantages of this method of increasing the surface are of a foil electrode include the additional cost of working with two metals and the decrease in stability associated with an intermetallic potential. Drake, in U.S. Pat. No. 4,309,810 also teaches the vacuum deposition of a metal vapor at a low angle onto a foil substrate, and presents an example of the deposition of aluminum on aluminum to give a columnar structure. Drake's foil has been found to be too brittle for use in electrolytic capacitors: it breaks when it is rolled into a cylindrical roll, the standard shape of an electrolytic capacitor. Neumann et al., in German Patent No. 4,127,743, report the vacuum deposition of aluminum on aluminum in a low pressure oxygen atmosphere, to give a surface structure of columns of aluminum separated by aluminum oxide. Allegret et al., in U.S. Pat. Nos. 5,431,971 and 5,482,743, also report the codeposition, under a low pressure oxidizing atmosphere, of a mixture of aluminum and aluminum oxide. Such mixed Al—$Al_2O_3$ surfaces are more robust mechanically than pure aluminum surfaces; but electrolytic capacitors incorporating them are known to have relatively high resistive losses and relatively low stability over time. In addition, the presence of both aluminum and large quantities of aluminum oxide in the surface of the foil makes difficult and less effective both stabilization by subsequent conventional chemical or electrochemical treatments and structure coarsening by subsequent annealing.

Having formed a foil electrode with high surface area, if the electrode is to be used as an anode, its surface must be oxidized. Conventionally, this is done by electrolytic anodization, in which the electrode is used as an anode in an electrochemical cell. Recent patents in this art include U.S. Pat. No. 4,537,665 to Nguyen et al., U.S. Pat. No. 4,582,574, to Nguyen et al., and U.S. Pat. No. 5,643,432 to Qiu. The thicker the oxide layer, the lower the capacitance of the electrolytic capacitor, but the higher the working voltage of the dielectric. For high voltage (upwards of 100V) applications, the dielectric layer is relatively thick, and tends to bridge over fine surface features, reducing the effective surface area of the anode.

Two other phenomena tend to reduce the effective surface areas of anodes made by electrolytic anodization. One is that in the course of the anodization process, oxygen and hydroxide ions migrate from the metal-dielectric interface into the metal, while metal ions migrate from the metal-dielectric interface into the dielectric. The other is that sharp points on the metal surface are characterized by high local electric fields, which accelerate the electrolytic process. Both of these phenomena tend to smooth out irregularities in the metal-dielectric interface.

There is thus a widely recognized need for, and it would be highly advantageous to have, improved methods for creating mechanically robust foil electrodes of high surface area.

SUMMARY OF THE INVENTION

According to the present invention there is provided a method for increasing the surface area of a substrate, including the steps of: (a) placing the substrate in an inert atmosphere having a pressure of between about $10^{-3}$ torr and about $10^{-2}$ torr; and (b) evaporating a valve metal onto the substrate under the inert atmosphere, thereby imparting a surface structure to the substrate.

According to the present invention there is provided a method of forming a dielectric layer on a substrate, including the steps of: (a) forming a discontinuous layer of an oxide of a first valve metal on the substrate; and (b) electrolytically anodizing the substrate subsequent to the forming of the discontinuous layer.

According to the present invention there is provided a method of forming a dielectric layer on a substrate, including the steps of: (a) evaporating onto the substrate a substance selected from the group consisting of valve metals and oxides thereof, thereby: (i) if the substance is a valve metal, forming a layer of an oxide of the valve metal on the substrate, and (ii) if the substance is an oxide of a valve metal, forming a layer of the oxide on the substrate; and (b) electrolytically anodizing the substrate subsequent to the forming of the oxide layer.

According to the present invention there is provided an article of manufacture including a valve metal having a fractal-like surficial structure.

According to the present invention there is provided an electrode including: (a) an electrically conductive substrate; and (b) a discontinuous layer, of an oxide of a first valve metal, on a surface of the substrate.

According to the present invention there is provided an anodized electrode, including: (a) an electrically conductive substrate; and (b) a dielectric coating, on a surface of the substrate, having a bimodal morphology.

The methods of the present invention are suited to increasing the surface area of any substrate, and to forming a dielectric layer on any substrate. Nevertheless, the primary application of the methods of the present invention is to the production of electrodes for electrolytic capacitors, and the methods of the present invention are illustrated herein with reference to this primary application.

According to a first aspect of the present invention, a valve metal such as aluminum is evaporated onto a foil surface in a low pressure atmosphere of an inert gas, preferably in the presence of a still lower, by between one and two orders of magnitude, pressure of oxygen. The inert gas may be any gas that does not react with the valve metal under process conditions, including noble gases such as helium and argon. In the experiments reported herein, the valve metal is aluminum and the inert gas is nitrogen.

The valve metal surface thus formed has a fractal-like structure, with a fractal dimension greater than 2. The scope of the present invention includes articles of manufacture in general, not just foil electrodes, that have valve metal surfaces or interfaces with such fractal-like surficial structures. This surficial structure may be on the surface of the article of manufacture, as in the case of a foil cathode of the present invention. Such a cathode has a higher capacitance than prior art cathodes of similar bulk composition and overall dimensions. Alternatively, the surficial structure may be an interface in the interior of the article of manufacture, as in the case of a foil anode, either a foil anode of the present invention or a foil anode formed by conventional anodization of a foil cathode of the present invention. In such an anode, the fractal-like valve metal surficial structure is covered by an oxide dielectric. In foil anodes of the present invention, the fractal-like surface structure allows the deposition of relatively thick dielectric layers while preserving the high surface area of the metal surface.

Because the present invention increases the surface area of a valve metal foil by adding material, rather than by removing material, as in conventional etching, the present invention allows the use of thinner foils in applications such as electrodes for electrolytic capacitors.

The scope of the present invention includes articles of manufacture in which the fractal-like surficial structure is formed on any substrate, including nonmetallic and even insulating substrates. Similarly, the scope of the present invention includes the evaporation of valve metals onto all suitable electrodes, including nonmetallic electrodes such as electrodes made of electrically conducting polymers. Nevertheless, the focus herein is on electrodes made of valve metal foil.

According to a second aspect of the present invention, a foil electrode is prepared for anodization by depositing thereon a surface layer, preferably a discontinuous surface layer, of a valve metal oxide. If the surface of the foil electrode is rough, then to the extent that sharp points on the surface are covered by the oxide thus deposited, those points are isolated from the surface-area-reducing effects of subsequent electrolytic anodization. On a smooth foil electrode surface, or on smooth portions of an otherwise rough foil electrode surface in between the sharp points, the subsequent electrolytic anodization takes place predominantly on portions of the surface left exposed after the deposition, thereby actually increasing the area of the metal-dielectric interface. The scope of the present invention includes the anode thus formed, which is distinguishable from prior art anodes because the dielectric layer thereof has a bimodal morphology: the non-electrolytically formed, preferably discontinuous layer is homogeneous, whereas the electrolytically formed layer is increasingly porous towards its outer surface, the pores being predominantly cylindrical and perpendicular to the outer surface.

The non-electrolytically formed surface oxide layer preferably is deposited by evaporation, either of the valve metal in the presence of low pressure oxygen, or of the valve metal oxide itself. Under both aspects of the present invention, it is most preferable that the metal of the foil electrode be the same as the valve metal deposited thereon as metal or as oxide. Optionally, a (preferably discontinuous) surface layer of an oxide of a second valve metal is deposited over the first surface layer before the electrolytic anodization.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method for producing foil electrodes and similar articles of manufacture of high surface area. Specifically, the present invention can be used to make improved electrodes for electrolytic capacitors.

The principles and operation of the production of foil electrodes according to the present invention may be better understood with reference to the drawings and the accompanying description.

The techniques of vacuum deposition, reactive evaporation and gas evaporation on which the present invention is based are well-known in the art and need not be repeated here. See, for example, D. M. Mattox, "Vacuum deposition, reactive evaporation and gas evaporation", *ASM Handbook, Volume 5: Surface Engineering*, 1994, pp. 556–581. Any suitable method may be used to evaporate the valve metal, for example, thermal resistive evaporation, electron beam evaporation and sputtering.

EXAMPLE 1
Deposition of Fractal-Like Aluminum Surfaces

Aluminum was evaporated, by thermal resistive evaporation, onto clean aluminum foil substrates held at a temperature of 300° C. in an anhydrous atmosphere of nitrogen at a pressure of between 0.002 torr and 0.005 torr and oxygen at pressures between $2 \times 10^{-4}$ torr and $5 \times 10^{-4}$ torr. The deposition rate was about 300 Å/sec.

Figure 1A:
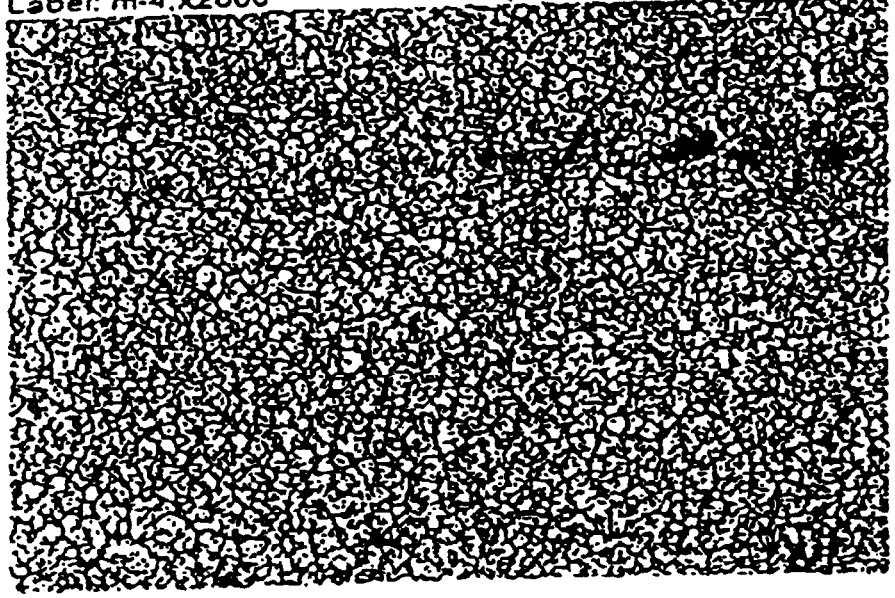
FIG. 1A is a photomicrograph of an aluminum surface of the present invention at a magnification of 2000.
Figure 1B:
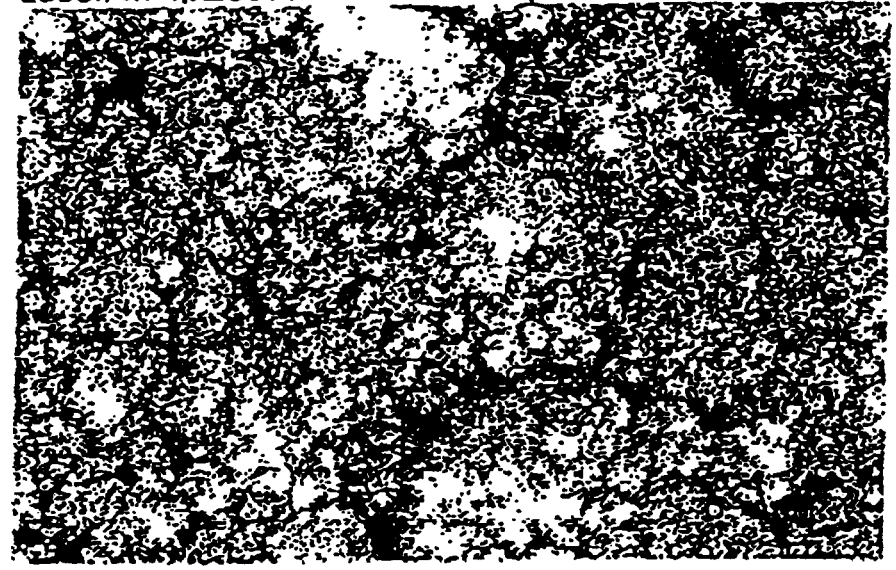
FIG. 1B is a photomicrograph of the surface of FIG. 1A at a magnification of 20,000.

FIGS. 1A and 1B are photomicrographs of a fractal-like aluminum surface so prepared. This surface has a cauliflower-like morphology, as reported by Bolz et al. in U.S. Pat. No. 5,571,158 for fractal-like inert metal surfaces. The "cauliflower heads" are about 2 microns across. The "florets" are about 0.2 microns across, so that the surface is self-similar at least on a distance scale from 0.2 microns to 2 microns. This is confirmed by the visual appearance of the surface. Unlike electrodes with greater than 50% aluminum oxide content, for example, the electrode of Allegret et al. or the electrode of Neumann et al., which are black and shiny (specularly reflective), this surface is black matte (diffusely reflective), showing that this surface has a fractal-like structure on the length scale of the wavelengths of visible light.

The following table is an EDS elemental analysis of one of the surfaces:

| | |
|---|---|
| N | 1.18% |
| O | 30.43% |
| Al | 66.38% |
| P | 1.79% |
| Ar | 0.22% |

It follows from stoichiometry that 30.3% of the aluminum was in the form of $Al_2O_3$ and 69.7% was in the form of aluminum metal.

Figure 2:
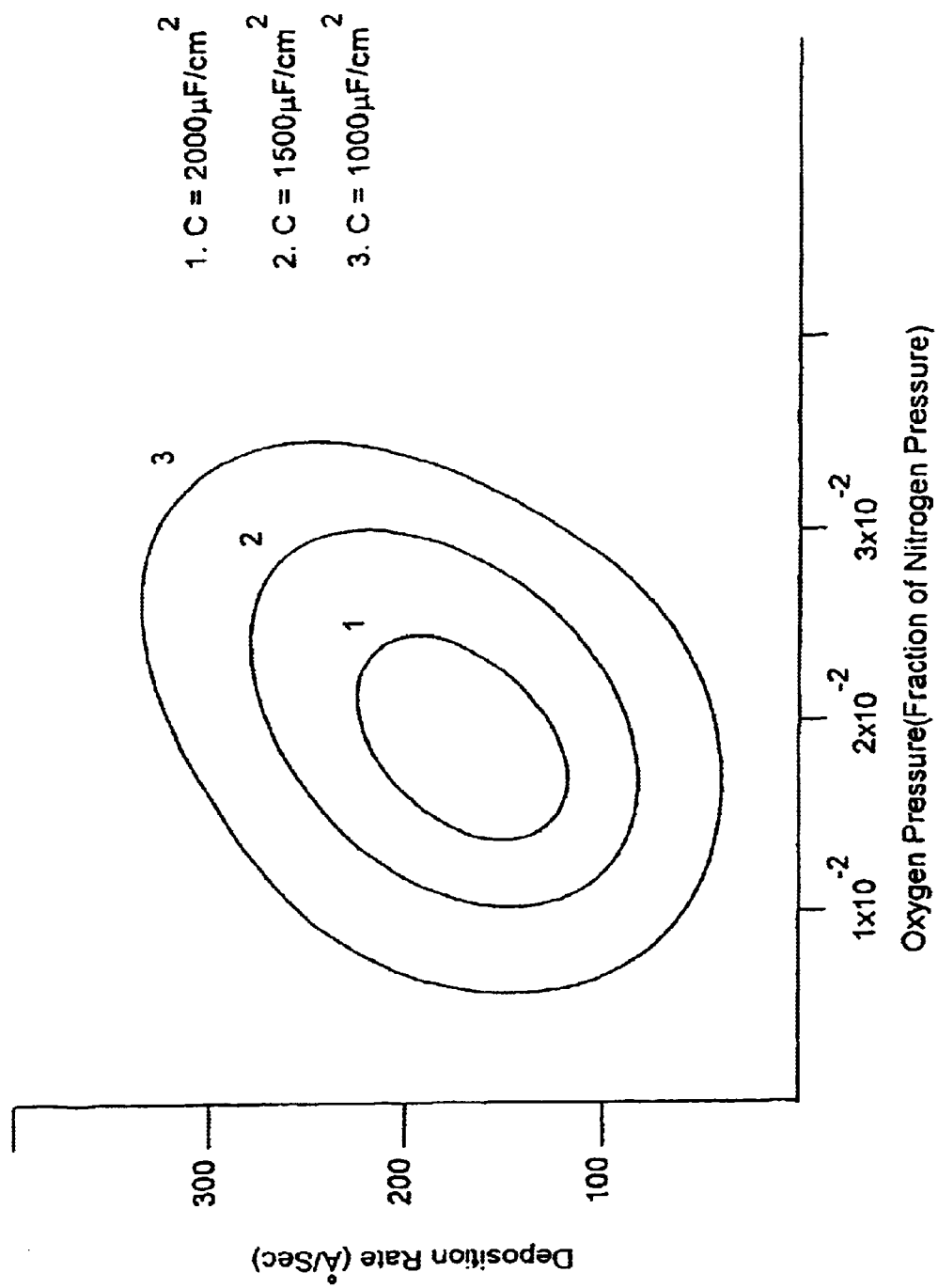
FIG. 2 is a contour plot of capacitance vs. oxygen pressure (as a fraction of nitrogen pressure) and aluminum deposition rate.

For the purpose of creating anodes for electrolytic capacitors, it is preferable that the aluminum be deposited to a thickness of between about 3 microns and about 6 microns. The preferred range of oxygen pressures is between one and two orders of magnitude less than the nitrogen pressure. Less oxygen than this produces electrodes of inferior mechanical strength. More oxygen than this produces capacitors of lower capacitance, because excessive aluminum oxide is included with the aluminum. FIG. 2 is a contour plot of the capacitance C of cathodes so produced, under nitrogen pressures between 0.002 torr and 0.004 torr, as a function of aluminum deposition rate, and as a function of oxygen pressure, expressed as a fraction of nitrogen pressure.

The capacitances of FIG. 2 were measured in an ethyleneglycol-based electrolyte having a conductivity of 85 Ω-cm. As noted above, the cathodes were prepared by thermal resistive evaporation. Electron beam deposition would provide a faster deposition rate and would have different optimum process parameters.

The cathodes of FIG. 2 were prepared by evaporating aluminum onto only one side of the aluminum foil substrates. If aluminum had been evaporated onto both sides of the substrates, the capacitances would have been doubled.

Holding the substrates at a temperature of 350° C. to 550° C. during the evaporation thereon of the aluminum tends to produce relatively coarse surface structures that are more resistant to dielectric overbridging than the finer surfaces obtained at lower temperatures. Alternatively, the surfaces may be coarsened by annealing at 350° C. to 550° C. under a reduced pressure of between $10^{-4}$ torr and $10^{-5}$ torr subsequent to evaporation. This annealing is more effective on the fractal-like surfaces of the present invention than on the columnar surfaces of Neumann et al. because the excessive aluminum oxide in the surface of Neumann et al. inhibits the coarsening associated with annealing. They also are more effective on the surfaces of the present invention, which include up to about 30% aluminum oxide, than on the surfaces of Allegret et al., which include more than 50% aluminum oxide.

It will be readily appreciated that the method of the present invention may be used to co-deposit other valve metals on the substrate, particularly titanium and tantalum, whose oxides have higher dielectric constants than aluminum and therefore give the electrolytic capacitor a higher capacitance.

Anodized Electrode

Figure 3A:
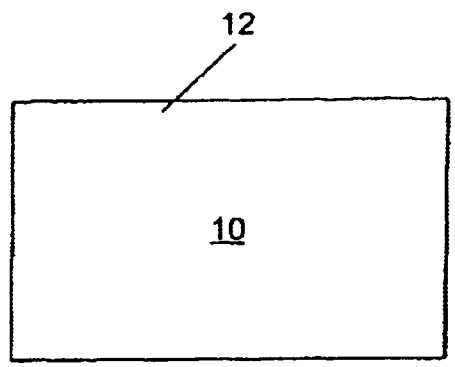
FIG. 3A is a schematic cross section of an aluminum foil with a smooth surface.
Figure 3B:
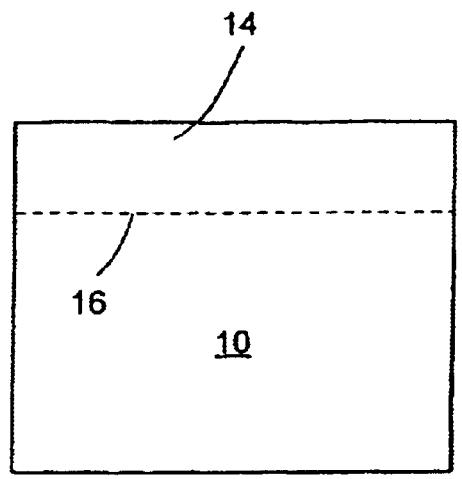
FIG. 3B (prior art) is a schematic cross section of the foil of FIG. 2A anodized conventionally.
Figure 3C:
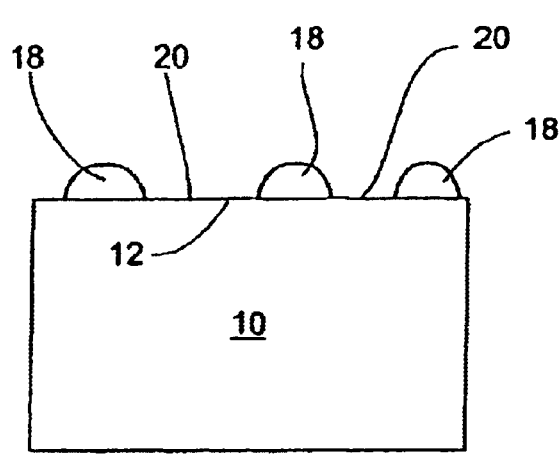
FIG. 3C is a schematic cross section of the foil of FIG. 2A with a discontinuous surface deposit of aluminum oxide.
Figure 3D:
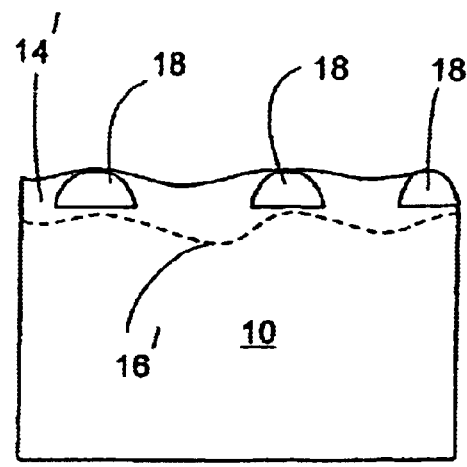
FIG. 3D is a schematic cross section of the foil of FIG. 2C after anodization.

Referring again to the drawings, FIGS. 3A through 3E illustrate the principle of the second aspect of the present invention as applied to increasing the surface area of the interface between a valve metal substrate and an overlying dielectric layer in an anodized electrode. FIG. 3A shows, schematically, a cross section of an aluminum foil 10 with a smooth, flat upper surface 12. FIG. 3B shows foil 10 after anodizing, with a dielectric layer 14 of aluminum oxide now present on interface 16. Because layer 14 was formed by a combination of outward migration of aluminum ions and inward migration of oxygen ions, interface 16 is lower into foil 10 than original surface 12; but, because the anodization process takes place uniformly on surface 12, interface 16 preserves the flat shape of surface 12. FIG. 3C shows foil 10 after the deposition thereon of regions 18 of a discontinuous layer of aluminum oxide, separated by gaps 20. FIG. 3D shows foil 10 after deposition and subsequent anodizing to form a dielectric layer 14' of aluminum oxide. Because anodizing proceeds preferentially in gaps 20, interface 16' between foil 10 and layer 14' is not flat.

Figure 3E:
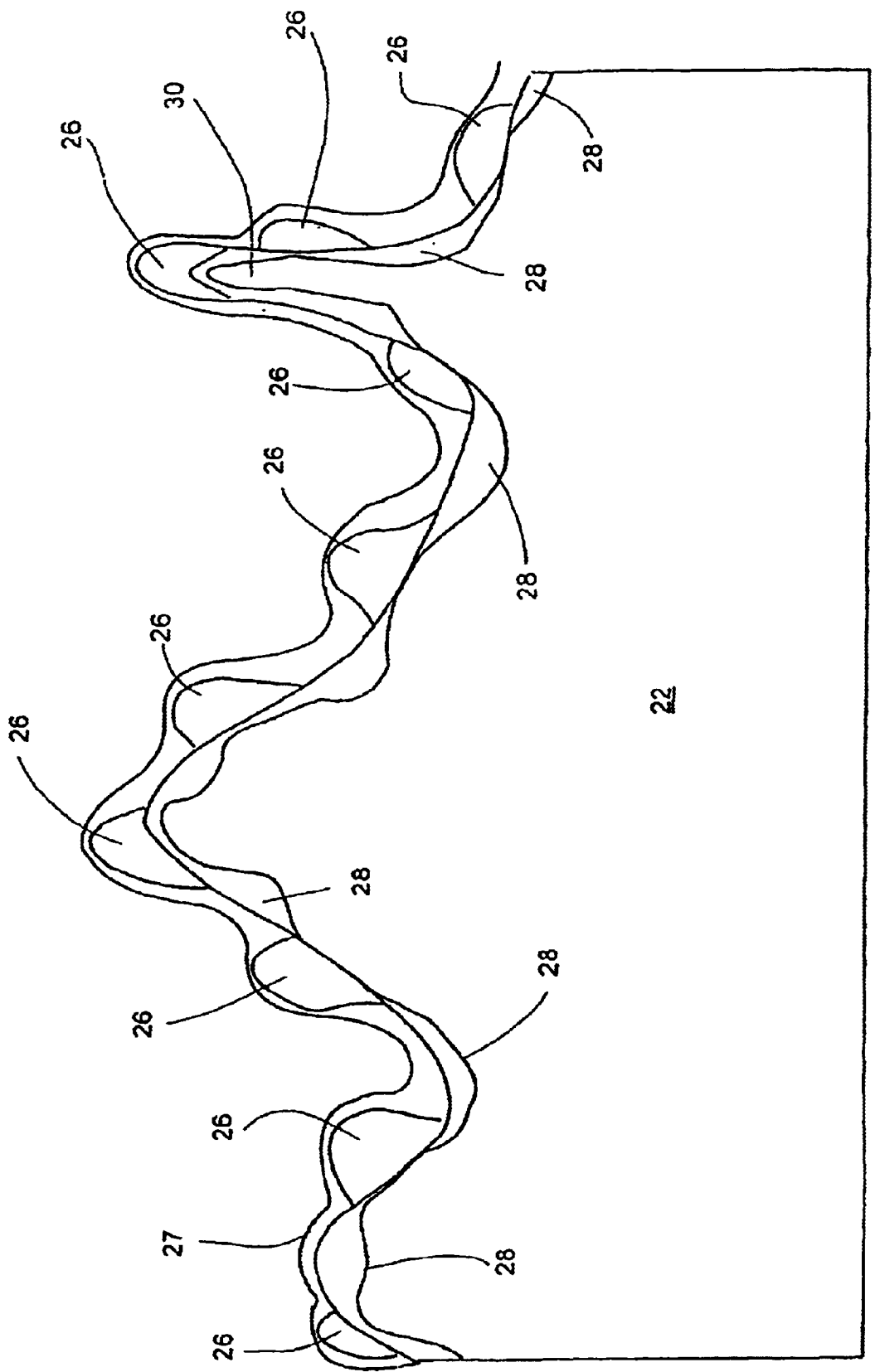
FIG. 3E is a schematic cross section of an aluminum foil with a rough surface, after deposition of a discontinuous surface oxide deposit and after anodization.

FIG. 3E shows schematically another aluminum foil 22 whose upper surface 24 has been roughened, for example by depositing thereon a layer of a valve metal such as aluminum by the method of the present invention, or by conventional etching of the upper surface. A discontinuous layer of valve metal oxide has been deposited on surface 24 by the method of the present invention. This discontinuous layer consists of discrete regions 26 deposited at random on surface 24. Some of regions 26 cover peaks, such as peak 30, in surface 24, protecting those peaks from subsequent degradation when a more continuous dielectric layer grows downward into foil 22 in the course of anodization. The layer formed by anodization has two portions: a lower barrier portion 28 and an upper portion 27. There is a vertical porosity gradient from lower portion 28 to upper portion 27, the pores being predominantly cylindrical and vertical and predominantly in portion 27. This porosity gradient provides a morphological distinction between anodized portions 27, 28 and the relatively homogeneous regions 26. This morphological distinction is enhanced if, prior to anodization, the foil with the discontinuous oxide layer is annealed thermally, to make the discontinuous layer denser and stronger. An example of a thermal annealing protocol is heating to 450° C. for 30 minutes under pure oxygen at a pressure of $5 \times 10^{-3}$ torr. In addition, a thermal oxide layer may be formed above and/or in between regions 26, as described by W. J. Bernard and S. M. Florio, in "Anodic oxide growth on aluminum in the presence of a thin thermal oxide layer", *J. Electrochem. Soc.: ELECTROCHEMICAL SCIENCE AND TECHNOLOGY*, Vol. 132 No. 10, October 1985, pp. 2319–2322.

Preferably, the discontinuous layer is deposited to a thickness equal to or slightly less than the thickness of the layer formed by anodization, and with a density and porosity comparable to the density and porosity of the barrier portion of the anodized layer. In this way, portions 27 and 28 that grow on the peaks of the valve metal surface are relatively thin, as illustrated in FIG. 3E. As in the prior art, the thickness of the layer formed by anodization is between 10 and 15 Å/V, where V is the forming voltage. The forming voltage is between 1.5 and 2 times the working voltage of the final capacitor.

EXAMPLE 2

Deposition of Discontinuous Aluminum Oxide Layer

Aluminum foils with fractal-like surfaces were prepared as in Example 1, except that the foils were heated as described above during the evaporation of the aluminum to promote the formation of coarser surface structures. On each foil, a discontinuous layer of aluminum oxide, 500 Å to 2000 Å thick, was deposited by thermal resistive evaporation of aluminum in a pure oxygen atmosphere, at oxygen pressures of between 0.0015 torr and 0.007 torr. This deposition was effected in the same chamber as that in which the foil was prepared, to avoid uncontrolled oxidation in ambient air. Layer thicknesses were measured as described by Mattox on page 569. Simple electrical resistance measurements transverse to the foils using dry probe electrodes showed that the foils had negligible resistance to the transverse flow of electricity (short circuit), showing that the aluminum oxide layers were indeed discontinuous. By contrast, a foil on which aluminum oxide was deposited to an estimated thickness of greater than 1 micron had negligible transverse conductance, showing that the 1 micron aluminum oxide layer created by the method of the second aspect of the present invention was continuous.

As an alternative to evaporation of aluminum in an oxidizing atmosphere, aluminum oxide may be evaporated directly onto foil 10. The direct evaporation of refractory oxides such as aluminum oxide has the disadvantage of requiring more heat than the evaporation of the corresponding metals. It also will be appreciated that other valve metal oxides, such as titanium oxide, may be deposited in discontinuous layers above discontinuous aluminum oxide layer 18. If this supplemental deposition is effected by evaporating the second valve metal in an oxygen atmosphere, the preferred oxygen pressure is between 0.003 torr and 0.007 torr, as in the case of aluminum evaporation.

Figure 4:
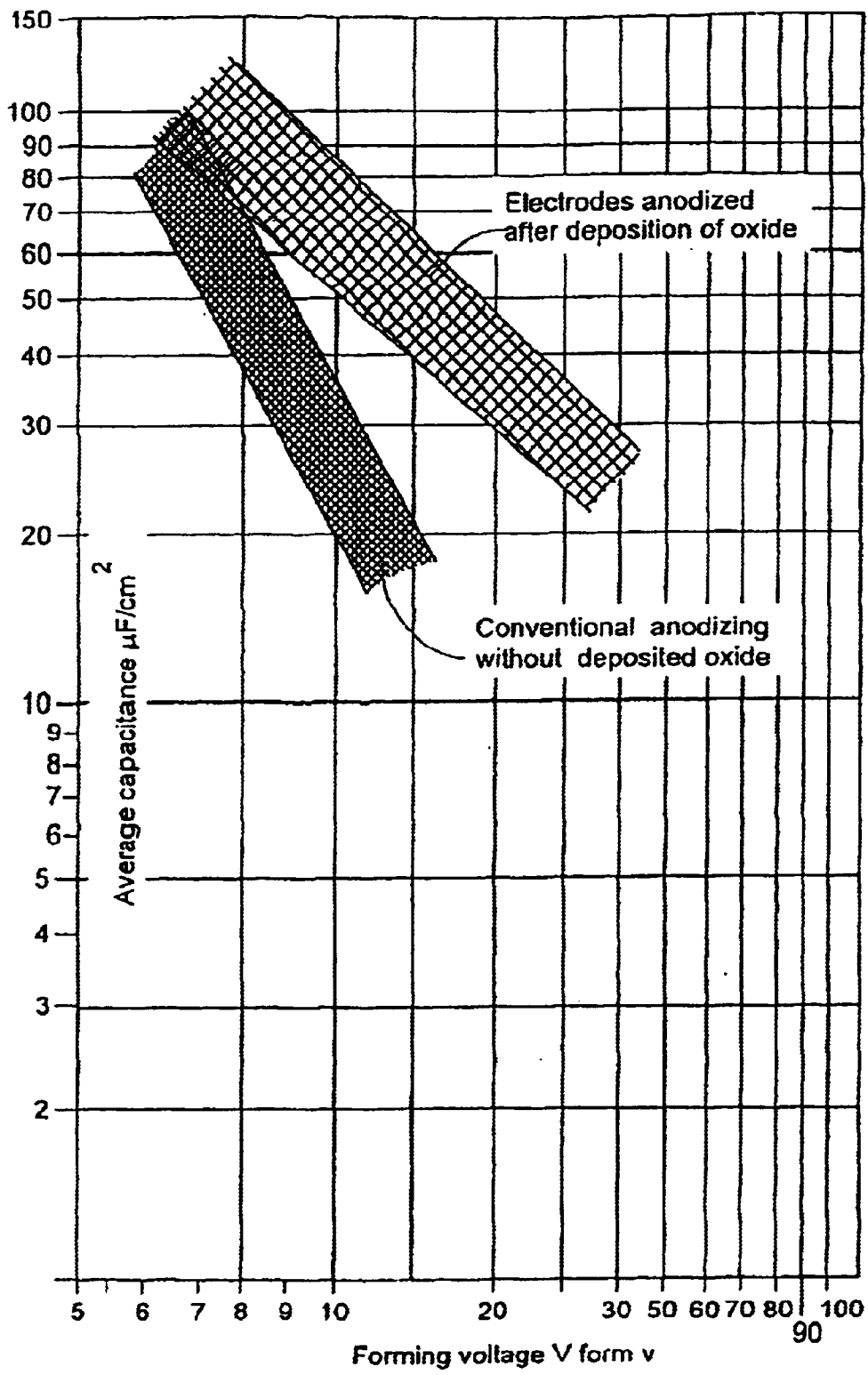
FIG. 4 compares capacitances of prior art anodes with capacitances of anodes prepared according to the present invention.

FIG. 4 compares the range of capacitances obtained for aluminum foil anodes prepared according to the present invention, with discontinuous deposition of aluminum oxide followed by standard electrolytic anodization, compared to the range of capacitances obtained for aluminum foil anodes prepared only by standard electrolytic anodization. In both cases, the aluminum foils were first processed as described above to provide the foils with fractal-like surfaces. The anodization was performed in an ethylene glycol based electrolyte at a temperature of 55° C. and a current density of 5 mA/cm$^2$. At forming voltages greater than about 8 volts, capacitors including anodes prepared according to the present invention have higher capacitances than corresponding capacitors including prior art anodes.

While the invention has been described with respect to a limited number of embodiments, it will be appreciated that many variations, modifications and other applications of the invention may be made.

What is claimed is:

1. A method for increasing the surface area of a substrate, comprising the steps of:
   (a) placing the substrate in an inert atmosphere, having a pressure of between $10^{-3}$ torr and $10^{-2}$ torr, into which oxygen has been introduced at a pressure of from one to two orders of magnitude less than said pressure of said inert atmosphere; and
   (b) evaporating at least one metal, selected from the group consisting of valve metals only, onto a heated substrate under said oxygen-containing inert atmosphere, whereby the product comprises a mixture of fractal surface structure including at least one valve metal and at least one valve metal oxide deposited on said substrate.

2. The method of claim 1, which is further characterized by at least one of the following features:
   (i) said inert atmosphere includes nitrogen;
   (ii) said inert atmosphere is anhydrous;
   (iii) said product is annealed at about 350° C. to about 550° C. under a reduced pressure of between $10^{-4}$ torr and $10^{-5}$ torr subsequent to step (b);
   (iv) said product is subjected to subsequent anodization;
   (v) said at least one metal is aluminum.

3. The method of claim 1, wherein said mixture of fractal surface structure comprises at least about 70 wt. % of at least one valve metal and at most about 30 wt. % of at least one valve metal oxide deposited on said substrate.

4. The method of claim 3, which is further characterized by at least one of the following features:
   (i) said inert atmosphere includes nitrogen;
   (ii) said inert atmosphere is anhydrous;
   (iii) said product is annealed at about 350° C. to about 550° C. under a reduced pressure of between $10^{-4}$ torr and $10^{-5}$ torr subsequent to step (b);
   (iv) said product is subjected to subsequent anodization;
   (v) said at least one metal is aluminum.

5. A method for increasing the surface area of a substrate, comprising the steps of:
   (a) placing the substrate in an inert atmosphere, having a pressure of between $10^{-3}$ torr and $10^{-2}$ torr, into which oxygen has been introduced at a pressure of from one to two orders of magnitude less than said pressure of said inert atmosphere; and
   (b) evaporating at least one metal, selected from the group consisting of valve metals only, onto a substrate heated at a temperature of at least about 300° C. under said oxygen-containing inert atmosphere, whereby the product comprises a mixture of fractal surface structure including at least one valve metal and at least one valve metal oxide deposited on said substrate.

6. The method of claim 5, which is further characterized by at least one of the following features:
   (i) said inert atmosphere includes nitrogen;
   (ii) said inert atmosphere is anhydrous;
   (iii) said product is annealed at about 350° C. to about 550° C. under a reduced pressure of between $10^{-4}$ torr and $10^{-5}$ torr subsequent to step (b);
   (iv) said product is subjected to subsequent anodization;
   (v) said at least one metal is aluminum.

7. The method of claim 5, wherein said mixture of fractal surface structure comprises at least about 70 wt. % of at least one valve metal and at most about 30 wt. % of at least one valve metal oxide deposited on said substrate.

8. The method of claim 7, which is further characterized by at least one of the following features:
   (i) said inert atmosphere includes nitrogen;
   (ii) said inert atmosphere is anhydrous;
   (iii) said product is annealed at about 350° C. to about 550° C. under a reduced pressure of between $10^{-4}$ torr and $10^{-5}$ torr subsequent to step (b);
   (iv) said product is subjected to subsequent anodization;
   (v) said at least one metal is aluminum.

9. A method for increasing the surface area of a substrate, comprising the steps of:
   (a) placing the substrate in an inert atmosphere, having a pressure of between $10^{-3}$ torr and $10^{-2}$ torr, into which oxygen has been introduced at a pressure of from one to two orders of magnitude less than said pressure of said inert atmosphere; and
   (b) evaporating at least one metal, selected from the group consisting of valve metals only, onto a substrate heated at a temperature of between about 350° C. and about 550° C. under said oxygen-containing inert atmosphere whereby the product comprises a mixture of fractal surface structure including at least one valve metal and at least one valve metal oxide deposited on said substrate.

10. The method of claim 9, which is further characterized by at least one of the following features:
    (i) said inert atmosphere includes nitrogen;
    (ii) said inert atmosphere is anhydrous;
    (iii) said product is annealed at about 350° C. to about 550° C. under a reduced pressure of between $10^{-4}$ torr and $10^{-5}$ torr subsequent to step (b);
    (iv) said product is subjected to subsequent anodization;
    (v) said at least one metal is aluminum.

11. The method of claim 9 wherein said mixture of fractal surface structure comprises at least about 70 wt. % of at least one valve metal and at most about 30 wt. % of at least one valve metal oxide deposited on said substrate.

12. The method of claim 11, which is further characterized by at least one of the following features:
    (i) said inert atmosphere includes nitrogen;
    (ii) said inert atmosphere is anhydrous;
    (iii) said product is annealed at about 350° C. to about 550° C. under a reduced pressure of between $10^{-4}$ torr and $10^{-5}$ torr subsequent to step (b);
    (iv) said product is subjected to subsequent anodization;
    (v) said at least one metal is aluminum.

* * * * *